United States Patent
Mun et al.

(10) Patent No.: US 9,356,259 B2
(45) Date of Patent: May 31, 2016

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Hyo-Young Mun, Yongin (KR); Young-Ji Kim, Yongin (KR); Dong-Myung Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/301,298

(22) Filed: Jun. 10, 2014

(65) Prior Publication Data

US 2015/0207095 A1    Jul. 23, 2015

(30) Foreign Application Priority Data

Jan. 17, 2014    (KR) .................. 10-2014-0006262

(51) Int. Cl.
*H01L 33/64*    (2010.01)
*H01L 51/52*    (2006.01)
*H01L 23/367*    (2006.01)

(52) U.S. Cl.
CPC ........... *H01L 51/529* (2013.01); *H01L 23/3677* (2013.01); *H01L 2251/5338* (2013.01); *H01L 2924/12041* (2013.01)

(58) Field of Classification Search
CPC .................. H01L 23/3677; H01L 2924/12041
See application file for complete search history.

(56) References Cited

U.S. PATENT DOCUMENTS

| 8,211,993 | B2 | 7/2012 | Harimoto et al. |
| 8,928,024 | B2 * | 1/2015 | Chen ............... H01L 33/58 257/98 |
| 2004/0027062 | A1 * | 2/2004 | Shiang et al. ............ 313/506 |
| 2004/0145310 | A1 * | 7/2004 | Su et al. .................. 313/512 |
| 2004/0188696 | A1 * | 9/2004 | Hsing Chen et al. ........ 257/99 |
| 2009/0090926 | A1 * | 4/2009 | Wang ............... H01L 25/167 257/99 |
| 2011/0256646 | A1 * | 10/2011 | Lin ........................... 438/27 |
| 2012/0168206 | A1 * | 7/2012 | Sekine et al. ............ 174/252 |
| 2012/0201037 | A1 * | 8/2012 | Nakayama .............. 362/382 |
| 2013/0189180 | A1 | 7/2013 | Ohta et al. |

FOREIGN PATENT DOCUMENTS

| JP | 10-286907 B1 | 10/1998 |
| KR | 10-2009-0111967 A | 10/2009 |
| KR | 10-2010-0017842 A | 2/2010 |
| KR | 10-2011-0050985 A | 5/2011 |
| KR | 10-1279469 B1 | 6/2013 |

OTHER PUBLICATIONS

Korean Patent Abstracts, Publication No. 1020130025641 A, dated Dec. 3, 2013, for corresponding Korean Patent 10-1279469 B1 listed above, 1 pages.

* cited by examiner

*Primary Examiner* — John C Ingham
(74) *Attorney, Agent, or Firm* — Lewis Roca Rothgerber Christie LLP

(57) ABSTRACT

Provided is an organic light-emitting display apparatus. The organic light-emitting display apparatus includes: a substrate; an organic light-emitting device provided on the substrate and comprising a first electrode, a second electrode, and an intermediate layer provided between the first electrode and the second electrode; an encapsulation layer covering the organic light-emitting device; a base layer disposed under the substrate and having a pin hole formed therein; and a thermal conductive layer filling the pin hole.

17 Claims, 5 Drawing Sheets

ORGANIC LIGHT-EMITTING DISPLAY APPARATUS AND METHOD OF MANUFACTURING THE SAME

RELATED APPLICATIONS

This application claims the benefit of Korean Patent Application No. 10-2014-0006262, filed on Jan. 17, 2014, in the Korean Intellectual Property Office, the disclosure of which is incorporated herein in its entirety by reference.

BACKGROUND

1. Field

One or more embodiments of the present invention relate to organic light-emitting display apparatuses and methods of manufacturing the same.

2. Description of the Related Art

An organic light-emitting display apparatus is a self-luminous display apparatus that includes a hole injection electrode, an electron injection electrode, and an organic emission layer formed therebetween and emits light when holes injected from an anode and electrons injected from a cathode are recombined in the organic emission layer.

Also, of portable electronic apparatuses, the organic light-emitting display apparatus is attracting attention as a next-generation display apparatus because it has high-quality characteristics such as low power consumption, high luminance, and high response speeds.

However, the organic light-emitting display apparatus has limits in portability and screen size when it uses a glass substrate that is heavy and fragile.

Therefore, a flexible organic light-emitting display apparatus is being developed by using a flexible substrate such as plastic. Accordingly, it is necessary to protect the inside of a display panel and the surface of a flexible substrate such as plastic.

SUMMARY

One or more embodiments of the present invention include organic light-emitting display apparatuses that have an improved heat dissipation function and a reduced thickness.

One or more embodiments of the present invention include methods of manufacturing the organic light-emitting display apparatuses.

Additional aspects will be set forth in part in the description which follows and, in part, will be apparent from the description, or may be learned by practice of the presented embodiments.

According to one or more embodiments of the present invention, an organic light-emitting display apparatus includes: a substrate; an organic light-emitting device provided on the substrate and including a first electrode, a second electrode, and an intermediate layer provided between the first electrode and the second electrode; an encapsulation layer covering the organic light-emitting device; a base layer disposed under the substrate and having a pin hole formed therein; and a thermal conductive layer filling the pin hole.

The organic light-emitting display apparatus may further include a polarization layer disposed on the encapsulation layer.

The organic light-emitting display apparatus may further include an adhesive layer formed between the substrate and the base layer to join the substrate and the base layer.

The organic light-emitting display apparatus may further include a light blocking layer disposed between the adhesive layer and the base layer.

The organic light-emitting display apparatus may further include a heat dissipation layer formed under the base layer to dissipate heat discharged through the thermal conductive layer.

The heat dissipation layer may include a transparent conductive layer.

The heat dissipation layer may include indium tin oxide (ITO) or carbon nanotube (CNT).

The pin hole may be formed in plurality.

The thermal conductive layer may include copper (Cu) or graphite.

According to one or more embodiments of the present invention, a method of manufacturing an organic light-emitting display apparatus includes: forming a pin hole in a base layer; forming a thermal conductive layer in a pin hole; forming an adhesive layer on the base layer; and joining the base layer to a substrate, on which an organic light-emitting device is disposed, by the adhesive layer.

The method may further include forming a heat dissipation layer on the base layer.

The base layer may be disposed between the adhesive layer and the heat dissipation layer.

The heat dissipation layer may include a transparent conductive layer.

The heat dissipation layer may include indium tin oxide (ITO) or carbon nanotube (CNT).

The method may further include forming a light blocking layer on the base layer.

The light blocking layer may be disposed between the adhesive layer and the base layer.

The pin hole may be formed in plurality.

The thermal conductive layer may include copper (Cu) or graphite.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
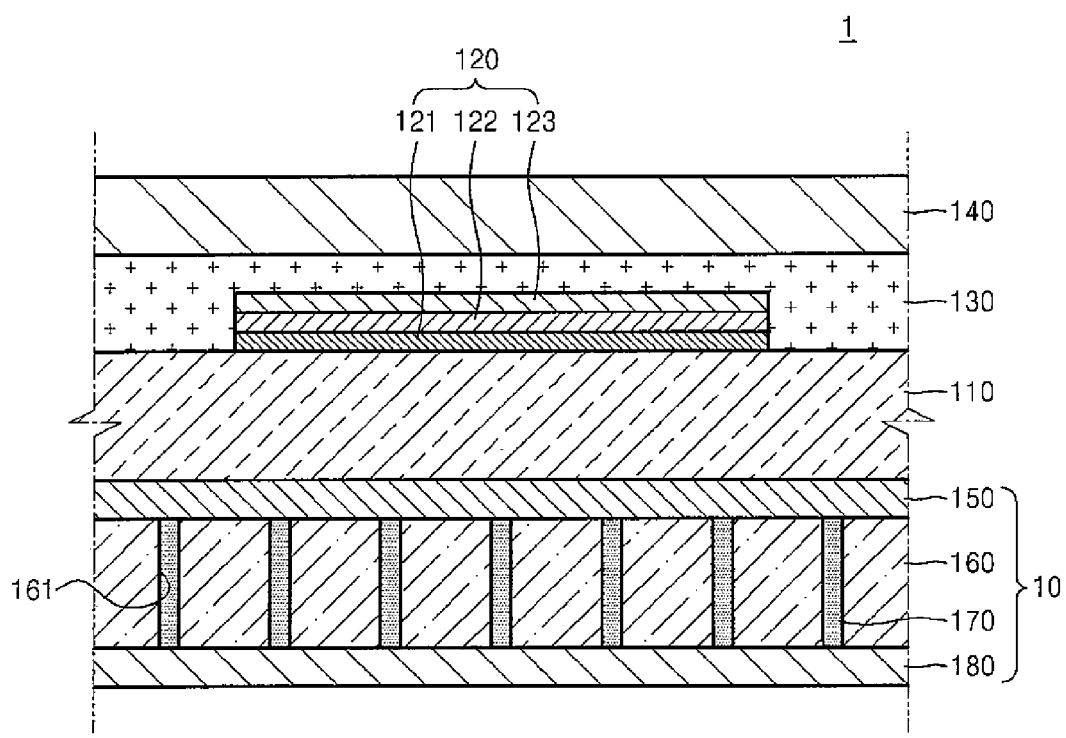
FIG. 1 is a cross-sectional view of an organic light-emitting display apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

The present invention may include various embodiments and modifications, and exemplary embodiments thereof are illustrated in the drawings and will be described herein in detail. The effects and features of the present invention and the accomplishing methods thereof will become apparent from the following description of the embodiments, taken in conjunction with the accompanying drawings. However, the prevent invention is not limited to the embodiments described below, and may be embodied in various modes.

Hereinafter, embodiments of the present invention will be described in detail with reference to the accompanying drawings. In the following description, like reference numerals denote like elements, and a redundant description thereof will be omitted.

It will be understood that although the terms "first", "second", etc. may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprise", "include" and "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of description. In other words, since sizes and thicknesses of components in the drawings are arbitrarily illustrated for convenience of description, the following embodiments are not limited thereto.

Hereinafter, exemplary embodiments of the present invention will be described in detail with reference to the accompanying drawings.

FIG. 1 is a cross-sectional view of an organic light-emitting display apparatus 1 according to an embodiment of the present invention. Referring to FIG. 1, the organic light-emitting display apparatus 1 includes a substrate 110, an organic light-emitting device 120 provided on the substrate 110, an encapsulation layer 130 covering the organic light-emitting device 120, a polarization layer 140 disposed on the encapsulation layer 130, and a protection film 10 disposed under the substrate 110.

The protection film 10 includes a base layer 160 having a pin hole 161 formed therein, a thermal conductive layer 170 filling the pin hole 161, an adhesive layer 150 formed between the substrate 110 and the base layer 160, and a heat dissipation layer 180 formed under the base layer 160.

The substrate 110 may be a substrate that is used in a general organic light-emitting device. For example, the substrate 110 may be a glass substrate or a plastic substrate that is excellent in mechanical strength, thermal stability, transparency, surface smoothness, handleability, and waterproofness. Although not illustrated in FIG. 1, as an example of various modifications, a planarization layer and an insulating layer may be further provided on the substrate 110.

The organic-light emitting device 120 is provided on the substrate 110. The organic light-emitting device 120 includes a first electrode 121, an intermediate layer 122, and a second electrode 123.

The first electrode 121 may be formed by vacuum deposition or sputtering, and may be a cathode or an anode. The first electrode 21 may be a transparent electrode, a semi-transparent electrode, or a reflective electrode, and may be formed of indium tin oxide (ITO), indium zinc oxide (IZO), tin oxide ($SnO_2$), zinc oxide (ZnO), aluminum (Al), silver (Ag), or magnesium (Mg); however, embodiments of the present invention are not limited thereto. Also, as an example of various modifications, the first electrode 121 may have a two or more-layered structure using two or more different materials.

The second electrode 123 may be formed by vacuum deposition or sputtering, and may be a cathode or an anode. The second electrode 123 may be formed of a metal having a low work function, an alloy, a conductive compound, or a mixture thereof. For example, the second electrode 123 may be formed of lithium (Li), magnesium (Mg), aluminum (Al), aluminum-lithium (Al—Li), calcium (Ca), magnesium-indium (Mg—In), or magnesium-silver (Mg—Ag). Also, as an example of various modifications, the second electrode 123 may have a two or more-layered structure using two or more different materials.

The intermediate layer 122 is provided between the first electrode 121 and the second electrode 123. The intermediate layer 122 includes an organic emission layer. As another example, the intermediate layer 122 includes an organic emission layer and may further include at least one of a hole injection layer (HIL), a hole transport layer (HTL), an electron transport layer (ETL), and an electron injection layer (EIL). However, the present embodiment is not limited thereto, and the intermediate layer 122 includes an organic emission layer and may further include other various functional layers.

A protection layer (not illustrated) may be further provided on the organic light-emitting device 120. The protection layer may be formed of an organic material or an inorganic material that may prevent the second electrode 123 of the organic light-emitting device 120 from being oxidized by moisture and oxygen. Also, as an example of various modifications, the protection layer may be formed of a compound of an organic material and an inorganic material.

The encapsulation layer 130 is formed on the substrate 110 to encapsulate the organic light-emitting device 120. The encapsulation layer 130 may include a plurality of inorganic layers, or may include an inorganic layer and an organic layer.

The organic layer of the encapsulation layer 130 is formed of a polymer and may be a single layer or a layer stack formed of any one of polyethylene terephthalate, polyimide, polycarbonate, epoxy, polyethylene, and polyacrylate. The organic layer may be formed of polyacrylate, and in detail, may include a polymerized monomer composition including a diacrylate-based monomer and a triacrylate-based monomer. The monomer composition may further include a monoacrylate-based monomer. Also, the monomer composition may further include a well-known photoinitiator such as trimethyl benzoyl diphenyl phosphine oxide (TPO), but embodiments of the present invention are not limited thereto.

The inorganic layer of the encapsulation layer 130 may be a single layer or a layer stack including a metal oxide and a metal nitride. In detail, the inorganic layer may include any one of $SiN_x$, $Al_2O_3$, $SiO_2$, and $TiO_2$.

A top layer of the encapsulation layer 130, which is exposed to the outside, may be formed of an inorganic layer in order to prevent the permeation of moisture into the organic light-emitting device 120.

The encapsulation layer 130 may include at least one sandwich structure in which at least one organic layer is inserted between at least two inorganic layers. As another example, the encapsulation layer 130 may include at least one sandwich structure in which at least one inorganic layer is inserted between at least two organic layers. As another example, the encapsulation layer 130 may include a sandwich structure in which at least one organic layer is inserted between at least two inorganic layers and a sandwich structure in which at least one inorganic layer is inserted between at least two organic layers.

The encapsulation layer 130 may include a first inorganic layer, a first organic layer, and a second inorganic layer that are sequentially formed from the top portion of the organic light-emitting device 120.

As another example, the encapsulation layer 130 may include a first inorganic layer, a first organic layer, a second inorganic layer, a second organic layer, and a third inorganic layer that are sequentially formed from the top portion of the organic light-emitting device 120.

As another example, the encapsulation layer 130 may include a first inorganic layer, a first organic layer, a second inorganic layer, a second organic layer, a third inorganic layer, a third organic layer, and a fourth inorganic layer that are sequentially formed from the top portion of the organic light-emitting device 120.

A halogenized thermal conductive layer, including a lithium fluoride (LiF), may be additionally included between the organic light-emitting device 120 and the first inorganic layer. The halogenized thermal conductive layer may prevent the organic light-emitting device 120 from being damaged when the first inorganic layer is formed by sputtering or plasma deposition.

An area of the first organic layer may be smaller than that of the second inorganic layer, and an area of the second organic layer may be smaller than that of the third inorganic layer.

As another example, the first organic layer may be completely covered by the second inorganic layer, and the second organic layer may be completely covered by the third inorganic layer.

The polarization layer 140 may be formed on the encapsulation layer 130. The polarization layer 140 may be formed of a polarization film. The polarization layer 140 may be formed of a metal-dielectric multilayer.

The encapsulation layer 130 and the polarization layer 140 become thinner. Since the encapsulation layer 130 and the polarization layer 140 become thinner, it is necessary to reduce the thickness of the protection film 10 disposed under the substrate 110, in order to form a neutral plane near the organic light-emitting device 120 when the organic light-emitting display apparatus 1 is bent. A vertical stress is generated at a section of a beam by a bending moment, and the neutral plane refers to a plane that has no normal stress generated therein, that is, a plane that does not extend or shorten The protection film 10 is disposed under the substrate 110. The protection film 10 may include the adhesive layer 150, the base layer 160, the thermal conductive layer 170, and the heat dissipation layer 180.

The base layer 160 is disposed under the substrate 110. The pin hole 161 is formed in the base layer 160. The base layer 160 may include a material such as polyethylene terephthalate (PET), polycarbonate (PC), polyethylene naphthalate (PEN), or cyclo-olefin polymer (COP). The pin hole 161 may be formed in plurality.

The thermal conductive layer 170 may fill the pin hole 161. The thermal conductive layer 170 may be formed of a material having high thermal conductivity. The thermal conductive layer 170 may include copper (Cu) or graphite. Since the thermal conductive layer 170 fills the pin hole 161, heat generated by the substrate 110 may be efficiently discharged through the thermal conductive layer 170 filling the pin hole 161. When the pin hole 161 is formed in plurality, since the thermal conductive layers 170 are also formed in the shape of a plurality of pillars, the heat may be discharged more efficiently.

The adhesive layer 150 may be formed between the substrate 110 and the base layer 160. The adhesive layer 150 may be formed to join the substrate 110 and the base layer 160. The adhesive layer 150 may be formed of an acryl-based or urethane-based adhesive.

The heat dissipation layer 180 may be formed under the base layer 160. The heat dissipation layer 180 may be formed of a material having a good heat dissipation function. The heat dissipation layer 180 may be formed of a transparent conductive layer. The heat dissipation layer 180 may include ITO or carbon nanotubes (CNT). The heat dissipation layer 180 may be formed under the base layer 160 to dissipate heat that is discharged through the thermal conductive layer 170.

Since the pin hole 161 of the base layer 160 is filled with the thermal conductive layer 170 and the heat dissipation layer 180 is formed under the base layer 160, a heat dissipation function may be improved. Also, according to the present embodiment, since only a thickness of the heat dissipation layer 180 is added under the base layer 160, the thickness of the protection film 10 may be reduced as compared with the related art case where a Cu tape and graphite are additionally formed under a base film in order to provide thermal conduction and heat dissipation.

Figure 2:
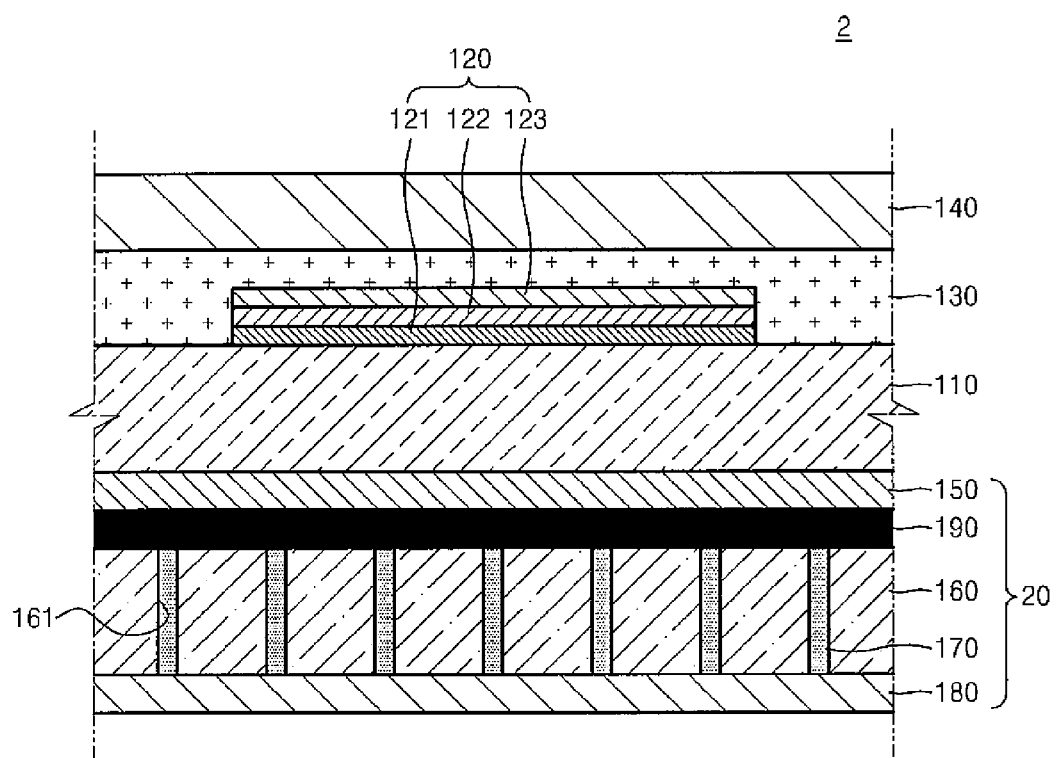
FIG. 2 is a cross-sectional view of an organic light-emitting display apparatus according to another embodiment of the present invention.

FIG. 2 is a cross-sectional view of an organic light-emitting display apparatus 2 according to another embodiment of the present invention.

Hereinafter, the present embodiment will be described focusing on a difference from the embodiment of FIG. 1. Herein, like reference numerals denote like elements throughout FIGS. 1 and 2.

Referring to FIG. 2, the organic light-emitting display apparatus 2 includes a substrate 110, an organic light-emitting device 120 provided on the substrate 110, an encapsulation layer 130 covering the organic light-emitting device 120, a polarization layer 140 disposed on the encapsulation layer 130, and a protection film 20 disposed under the substrate 110. The protection film 20 includes a base layer 160 having a pin hole 161 formed therein, a thermal conductive layer 170 filling the pin hole 161, an adhesive layer 150 formed between the substrate 110 and the base layer 160, a heat dissipation layer 180 formed under the base layer 160, and a light blocking layer 190 formed between the adhesive layer 150 and the base layer 160.

The light blocking layer 190 may be formed between the adhesive layer 150 and the base layer 160. The light blocking layer 190 may be formed of a material that may block light. The light blocking layer 190 may be formed by adding ink to a material such as PET, P/c, PEN, or COP. The exposure of a pattern under a display panel may be prevented by the light blocking layer 190.

Hereinafter, a method of manufacturing the organic light-emitting display apparatus 1 of FIG. 1 will be described with reference to FIGS. 3A to 3F.

Figure 3A:
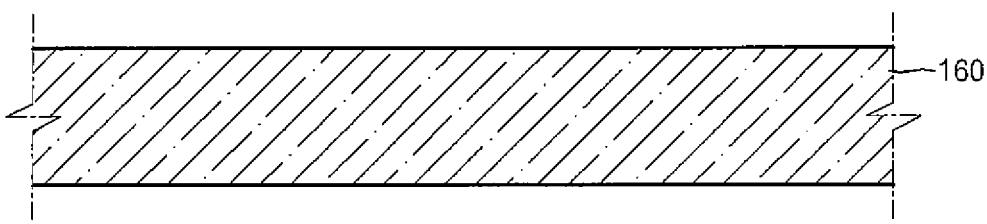
FIGS. 3A to 3F are cross-sectional views illustrating a method of manufacturing the organic light-emitting display apparatus of FIG. 1, according to an embodiment of the present invention.

First, as illustrated in FIG. 3A, a base layer 160 is prepared.

Figure 3B:
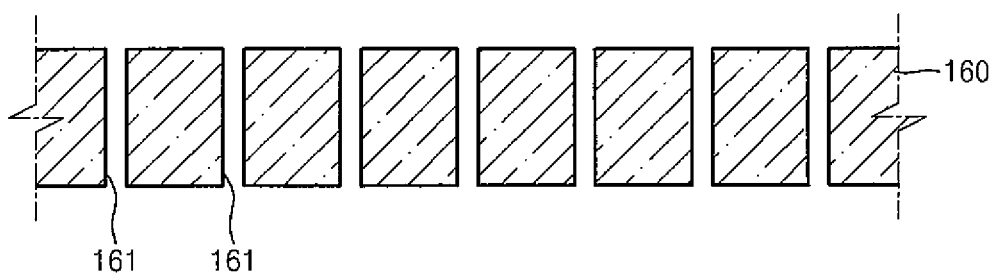

Thereafter, as illustrated in FIG. 3B, a pin hole 161 is formed in the base layer 160. The pin hole 161 may be formed in plurality.

Figure 3C:
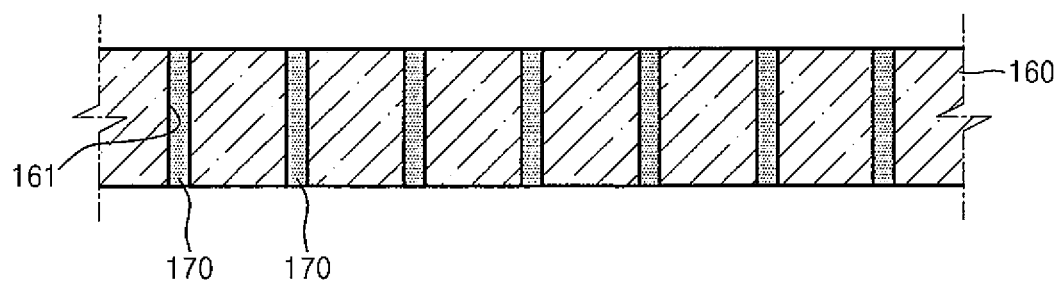

Thereafter, as illustrated in FIG. 3C, a thermal conductive layer 170 is formed to fill the pin hole 161. When the thermal conductive layer 170 is formed of a metal, the thermal conductive layer 170 may be formed by metal layer deposition.

Figure 3D:
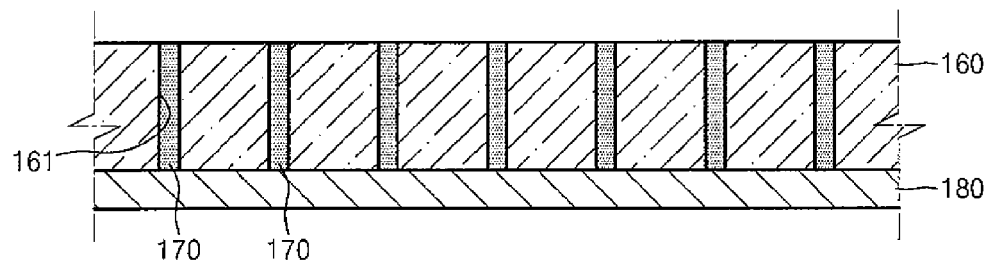

Thereafter, as illustrated in FIG. 3D, a heat dissipation layer 180 is formed on the base layer 160. The heat dissipation layer 180 may be formed of a transparent conductive layer. The heat dissipation layer 180 may be formed by coating or deposition.

Figure 3E:
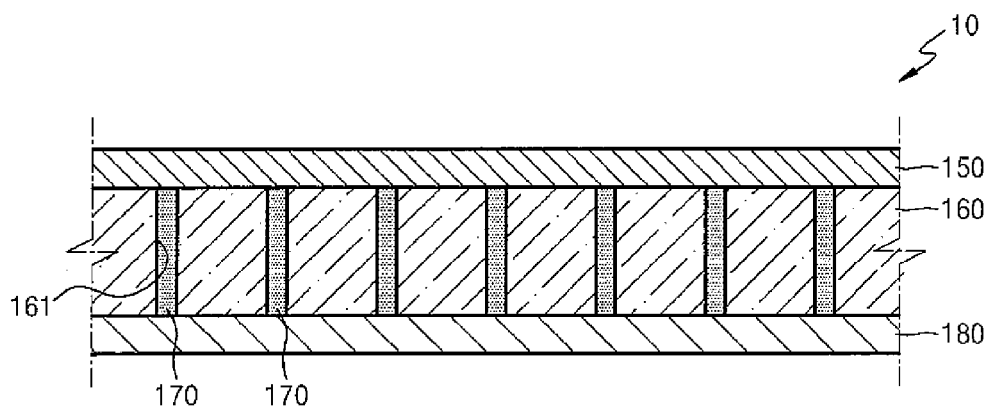

Thereafter, as illustrated in FIG. 3E, an adhesive layer 150 is formed on the base layer 160. Accordingly, a protection film 10 according to an embodiment may be completed. Also, although not illustrated in the drawings, a light blocking layer 190 may be formed directly on the base layer 160 before forming the adhesive layer 150.

When the adhesive layer 150 is formed on the light blocking layer 190, a protection film 20 according to another embodiment may be completed.

Figure 3F:
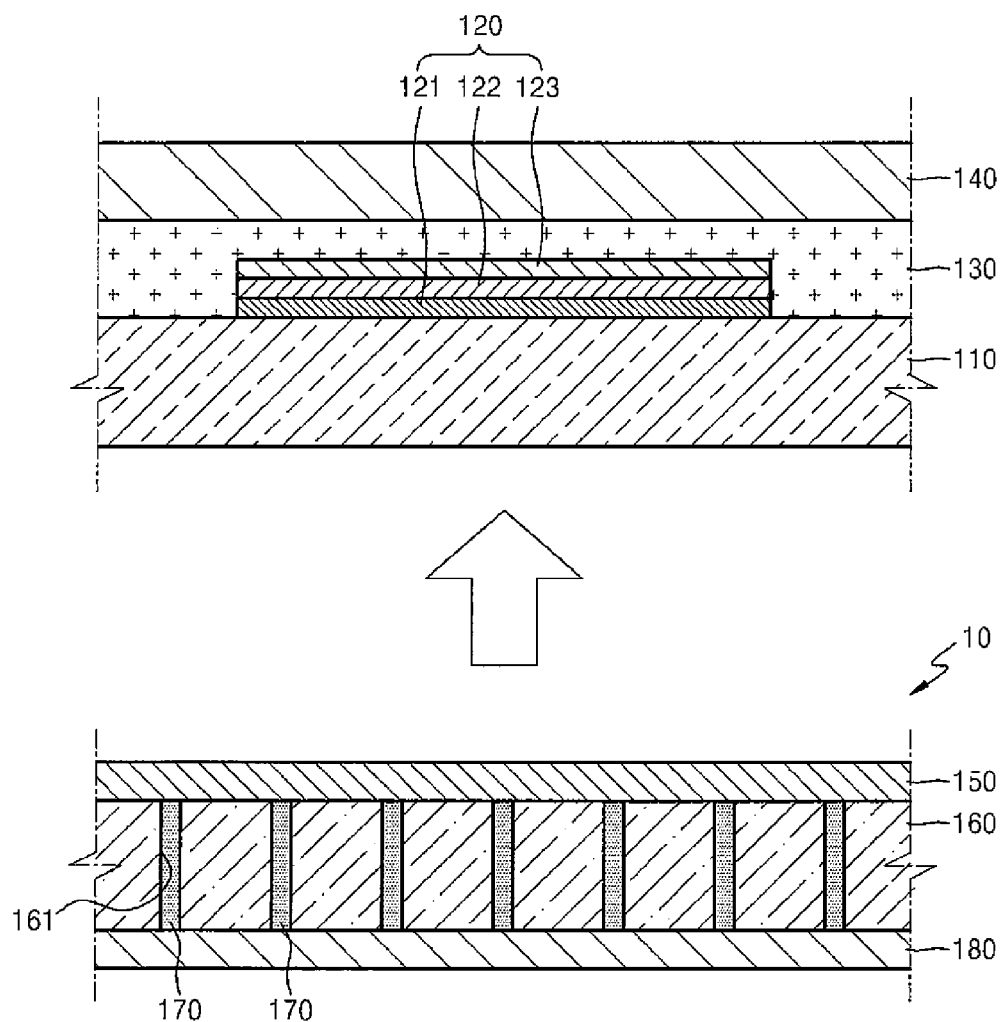

Thereafter, as illustrated in FIG. 3F, the protection film 10 according to an embodiment is joined to the substrate 110, on which the organic light-emitting device 120 is formed, by the adhesive layer 150. Accordingly, the organic light-emitting display apparatus 1 according to an embodiment of the present invention may be manufactured. Also, although not illustrated in the drawings, by joining the protection film 20 according to another embodiment to the substrate 110, on which the organic light-emitting device 120 is formed, by the adhesive layer 150, the organic light-emitting display apparatus 2 according to another embodiment of the present invention may be manufactured.

As described above, according to the one or more of the above embodiments of the present invention, slim organic light-emitting display apparatuses having an improved heat dissipation function may be embodied.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display apparatus comprising:
    a substrate;
    an organic light-emitting device on a first side of the substrate and comprising a first electrode, a second electrode, and an intermediate layer between the first electrode and the second electrode;
    an encapsulation layer covering the organic light-emitting device;
    a base layer on a second side of the substrate opposite to the first side of the substrate and the base layer having a pin hole therein;
    a thermal conductive layer in the pin hole; and
    an adhesive layer between the substrate and the base layer to join the substrate with the base layer.

2. The organic light-emitting display apparatus of claim 1, further comprising a polarization layer on the encapsulation layer.

3. The organic light-emitting display apparatus of claim 1, further comprising a light blocking layer between the adhesive layer and the base layer.

4. The organic light-emitting display apparatus of claim 1, further comprising a heat dissipation layer under the base layer to dissipate heat discharged through the thermal conductive layer.

5. The organic light-emitting display apparatus of claim 4, wherein the heat dissipation layer comprises a transparent conductive layer.

6. The organic light-emitting display apparatus of claim 5, wherein the heat dissipation layer comprises indium tin oxide (ITO) and/or carbon nanotube (CNT).

7. The organic light-emitting display apparatus of claim 1, wherein the pin hole comprises a plurality of pinholes.

8. The organic light-emitting display apparatus of claim 1, wherein the thermal conductive layer comprises copper (Cu) and/or graphite.

9. A method of manufacturing an organic light-emitting display apparatus, the method comprising:
    forming a pin hole in a base layer;
    forming a thermal conductive layer in the pin hole;
    forming an adhesive layer on the base layer; and
    joining the base layer to a substrate, on which an organic light-emitting device is disposed,
    wherein the forming of the thermal conductive layer comprises forming the thermal conductive layer in the pin hole to discharge heat generated by the substrate through the thermal conductive layer filling the pin hole.

10. The method of claim 9, further comprising forming a heat dissipation layer on the base layer.

11. The method of claim 10, wherein the base layer is between the adhesive layer and the heat dissipation layer.

12. The method of claim 10, wherein the heat dissipation layer comprises a transparent conductive layer.

13. The method of claim 12, wherein the heat dissipation layer comprises indium tin oxide (ITO) and/or carbon nanotube (CNT).

14. The method of claim 9, further comprising forming a light blocking layer on the base layer.

15. The method of claim 14, wherein the light blocking layer is between the adhesive layer and the base layer.

16. The method of claim 9, wherein the pin hole comprises a plurality of pin holes.

17. The method of claim 9, wherein the thermal conductive layer comprises copper (Cu) and/or graphite.

* * * * *